US012381131B2

(12) United States Patent
Kirby et al.

(10) Patent No.: US 12,381,131 B2
(45) Date of Patent: *Aug. 5, 2025

(54) FRONT END OF LINE INTERCONNECT STRUCTURES AND ASSOCIATED SYSTEMS AND METHODS

(71) Applicant: Micron Technology, Inc., Boise, ID (US)

(72) Inventors: Kyle K. Kirby, Eagle, ID (US); Kunal R. Parekh, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/507,721

(22) Filed: Nov. 13, 2023

(65) Prior Publication Data

US 2024/0087987 A1 Mar. 14, 2024

Related U.S. Application Data

(63) Continuation of application No. 17/325,122, filed on May 19, 2021, now Pat. No. 11,817,305.

(Continued)

(51) Int. Cl.

*H01L 23/48* (2006.01)
*H01L 21/768* (2006.01)

(Continued)

(52) U.S. Cl.

CPC ...... *H01L 23/481* (2013.01); *H01L 21/76877* (2013.01); *H01L 24/08* (2013.01);

(Continued)

(58) Field of Classification Search

CPC . H01L 23/481; H01L 21/76877; H01L 24/08; H01L 24/80; H01L 2224/08146;

(Continued)

(56) References Cited

U.S. PATENT DOCUMENTS 10,199,326 B1 2/2019 Ohsaki
10,354,980 B1 7/2019 Mushiga et al.

(Continued)

OTHER PUBLICATIONS

International Application No. PCT/US2021/046461—International Search Report and Written Opinion, mailed Dec. 10, 2021, 13 pages.

(Continued)

*Primary Examiner* — Niki H Nguyen

(74) *Attorney, Agent, or Firm* — Dorsey & Whitney LLP

(57) ABSTRACT

Systems and methods for a semiconductor device having a front-end-of-line structure are provided. The semiconductor device may include a dielectric material having a backside formed on a front side of a semiconductor substrate material and a front side, and an interconnect structure extending through the dielectric material. The interconnect structure may be electrically connected to a semiconductor memory array proximate the front side of the dielectric material. The semiconductor device may further have an insulating material encasing at least a portion of the semiconductor memory array and an opening created during back-end-of-line processing through which the active contact surface at the backside of the interconnect structure is exposed for electrical connection.

18 Claims, 12 Drawing Sheets

Related U.S. Application Data

(60) Provisional application No. 63/175,443, filed on Apr. 15, 2021, provisional application No. 63/071,983, filed on Aug. 28, 2020, provisional application No. 63/071,969, filed on Aug. 28, 2020.

(51) Int. Cl.
*H01L 23/00* (2006.01)
*H01L 23/52* (2006.01)
*H01L 29/40* (2006.01)

(52) U.S. Cl.
CPC .... *H01L 24/80* (2013.01); *H01L 2224/08146* (2013.01); *H01L 2224/80895* (2013.01); *H01L 2224/80896* (2013.01)

(58) Field of Classification Search
CPC ........... H01L 2224/80895; H01L 2224/80896; H10B 43/27; H10B 41/27; H10B 43/35; H10B 41/35; H10B 69/00; H10B 41/30; H10B 12/00; H10B 12/482; H10B 12/30; H10B 12/488; H10B 61/00; H10B 63/10; H10B 63/34; H10B 10/00; H10B 41/42; H10B 53/00; H10B 12/20; H10B 63/00; H10B 12/36; H10B 12/056; H10B 12/395; H10B 51/00; H10B 10/18; H10B 12/377; H10B 12/036; H10B 12/39; H10B 12/373; H10B 99/16; H10B 12/10; H10B 20/27; H10B 41/47; H10B 99/10
See application file for complete search history.

(56) References Cited

U.S. PATENT DOCUMENTS 10,629,616 B1 4/2020 Kai et al.
10,903,164 B2 1/2021 Nishida
11,171,097 B2 11/2021 Said et al.
11,195,857 B2 12/2021 Kai et al.
11,201,107 B2 12/2021 Okina et al.
11,322,466 B2 5/2022 Okina
11,355,486 B2 6/2022 Mizutani et al.
11,817,305 B2 * 11/2023 Kirby .................... H01L 23/481
2007/0032059 A1 2/2007 Hedler et al.
2011/0031633 A1 2/2011 Hsu et al.
2011/0089572 A1 4/2011 Tezcan et al.
2012/0132967 A1 5/2012 Andry et al.
2012/0153500 A1 6/2012 Kim et al.
2015/0102497 A1 4/2015 Park et al.
2015/0380339 A1 12/2015 Zhao et al.
2017/0179026 A1 6/2017 Toyama et al.
2017/0179154 A1 * 6/2017 Furihata ............... H10D 89/911
2018/0145030 A1 5/2018 Beyne et al.
2019/0051599 A1 2/2019 Zhang et al.
2019/0296041 A1 9/2019 Yamasaka et al.
2020/0020684 A1 1/2020 Chen et al.
2020/0098776 A1 3/2020 Sugisaki
2020/0258816 A1 8/2020 Okina et al.
2020/0258904 A1 8/2020 Kai et al.
2020/0266146 A1 8/2020 Nishida
2020/0295037 A1 9/2020 Iijima et al.
2020/0381384 A1 12/2020 Huo et al.
2021/0035965 A1 2/2021 Mizutani et al.
2021/0327807 A1 10/2021 Chen et al.
2022/0068765 A1 3/2022 Kirby et al.
2022/0068820 A1 3/2022 Kirby et al.

OTHER PUBLICATIONS

International Search Report and Written Opinion mailed on Feb. 22, 2022 for International Patent Application No. PCT/US2021/046455, 19 pages.

* cited by examiner

FRONT END OF LINE INTERCONNECT STRUCTURES AND ASSOCIATED SYSTEMS AND METHODS

CROSS-REFERENCE TO RELATED APPLICATION

This application is a continuation of U.S. patent application Ser. No. 17/325,122, filed on May 19, 2021, now U.S. Pat. No. 11,817,305; which claims the benefit of U.S. Provisional Patent Application No. 63/175,443, filed on Apr. 15, 2021; U.S. Provisional Patent Application No. 63/071,969, filed on Aug. 28, 2020; and U.S. Provisional Patent Application No. 63/071,983, filed on Aug. 28, 2020, each of which are incorporated herein by reference in their entirety.

TECHNICAL FIELD

The present disclosure is generally directed to semiconductor devices, and in several embodiments, more particularly to systems and methods of forming pre-positioned front-end-of-line interconnect structures for backside electrical connections.

BACKGROUND

Microelectronic devices, such as memory devices, microprocessors, and light emitting diodes, typically include one or more semiconductor dies mounted to a substrate and encased in a protective covering. The semiconductor dies include functional features, such as memory cells, processor circuits, interconnecting circuitry, etc. Semiconductor die manufacturers are under increasing pressure to reduce the volume occupied by semiconductor dies while increasing the capacity and/or speed of the resulting encapsulated assemblies. To meet these and other demands, semiconductor die manufacturers often stack multiple semiconductor dies vertically on top of each other to increase the capacity or performance of a microelectronic device within the limited volume on the circuit board or other element to which the semiconductor dies are mounted. In vertical semiconductor die stack assemblies, through-silicon vias (TSV) are often used to make an electrical connection through a die.

In semiconductor device fabrication, front-end-of-line (FEOL) processing is used to form individual devices (transistors, capacitors, resistors, etc.) at the active side of the semiconductor substrate. In conventional semiconductor device assemblies, back-end-of-line (BEOL) processing of the substrate is used to form various interconnects for backside electrical connections, e.g., through silicon vias, metalization layers, bond pads, etc. Conventional BEOL processing methods for forming interconnects require extensive processing time and complex fabrication operations, and they also have limited design options for routing configurations. BEOL processing generally occurs immediately before a probe stage, where signals are physically acquired from the internal nodes of a semiconductor device for failure analysis and defect detection.

DETAILED DESCRIPTION

Figure 1A:
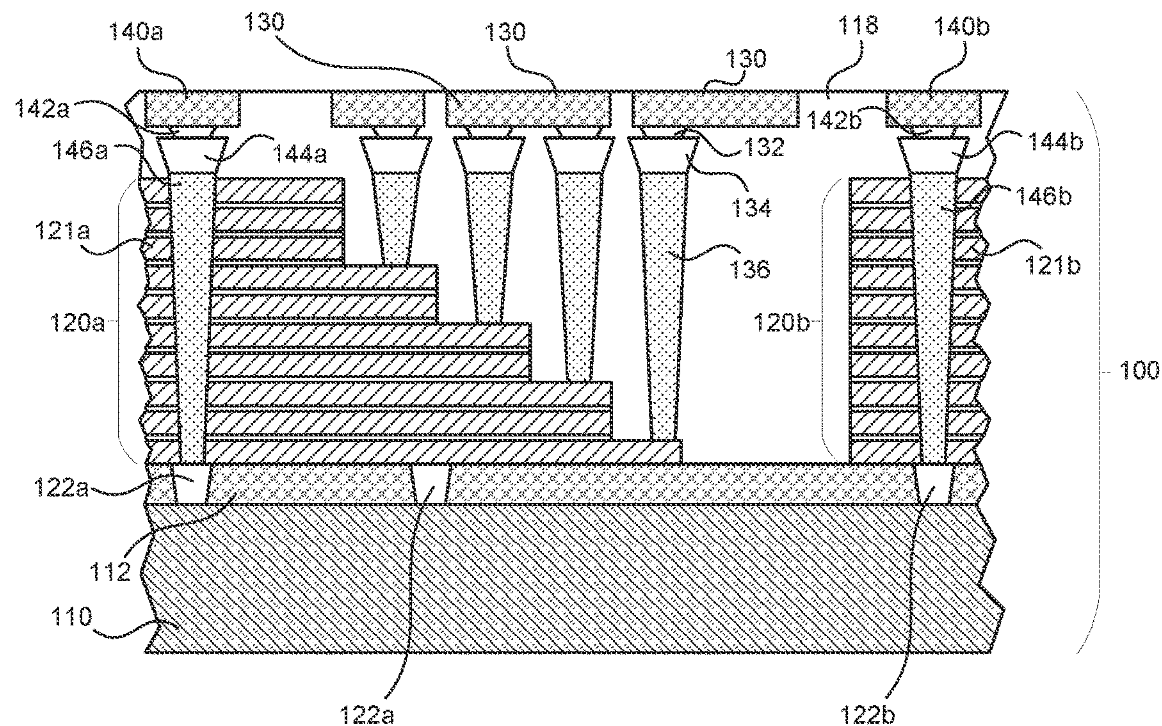
FIGS. 1A-1G are enlarged cross-sectional views showing various stages of fabricating a semiconductor device having a front-end-of-line interconnect structure in accordance with embodiments of the present technology.
Figure 1A:
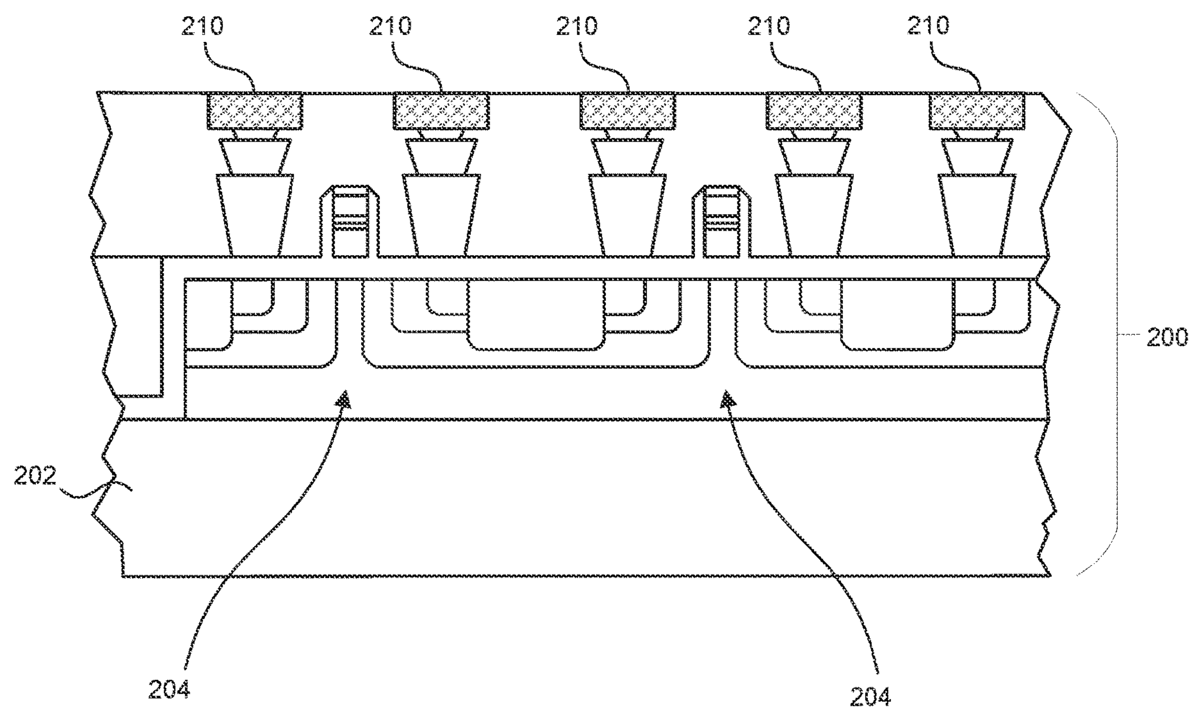
Figure 1B:
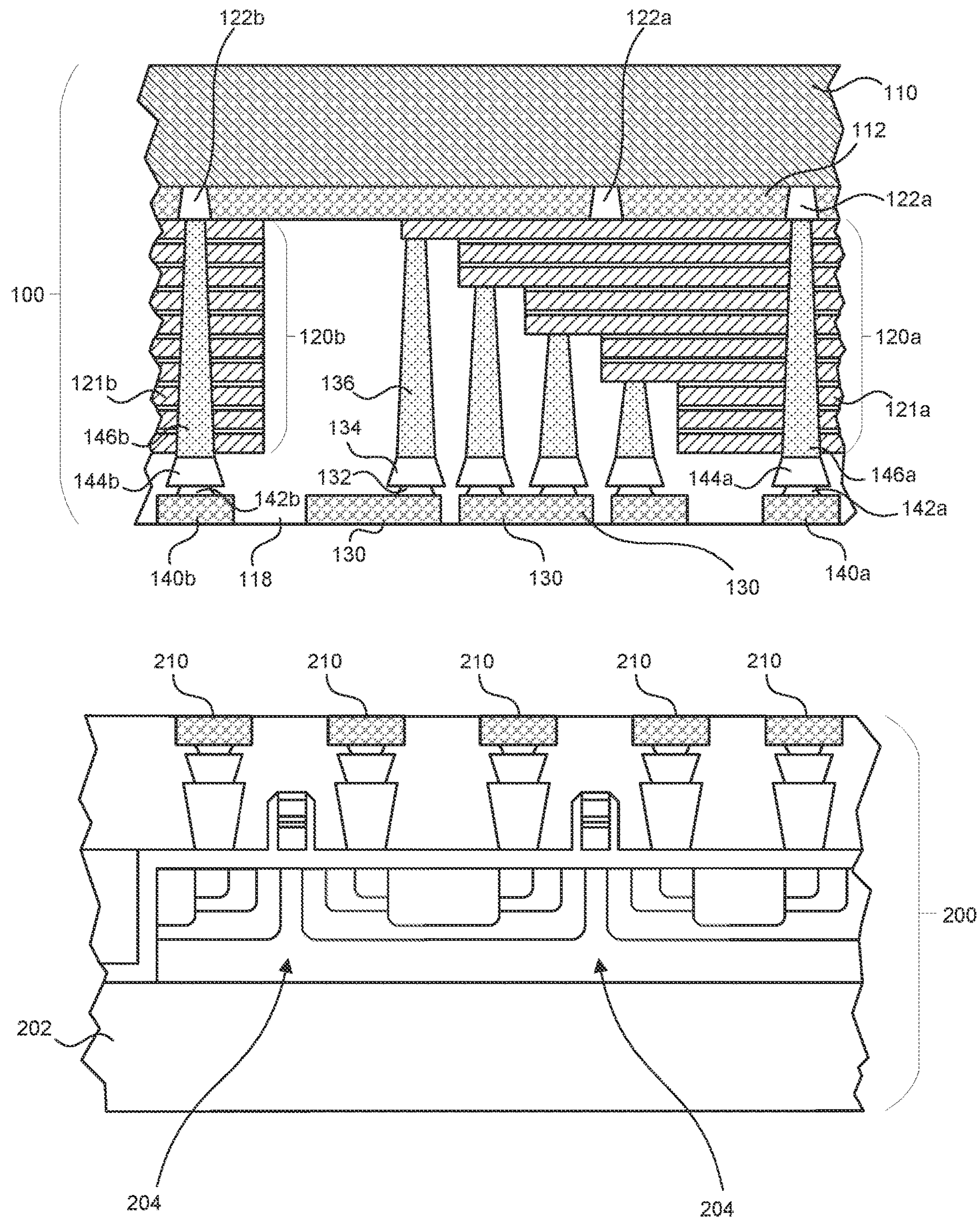

The technology disclosed herein relates to semiconductor devices, systems with semiconductor devices, and related methods for manufacturing semiconductor devices. The term "semiconductor device" generally refers to a solid-state device that includes one or more semiconductor materials. Examples of semiconductor devices include logic devices, memory devices, and diodes, among others. Furthermore, the term "semiconductor device" can refer to a finished device or to an assembly or other structure at various stages of processing before becoming a finished device.

Depending upon the context in which it is used, the term "substrate" can refer to a structure that supports electronic components (e.g., a die), such as a wafer-level substrate, a singulated die-level substrate, or another die for die-stacking applications. Suitable steps of the methods described herein can be performed at the wafer-level or at the die level. Furthermore, unless the context indicates otherwise, structures disclosed herein can be formed using conventional semiconductor-manufacturing techniques. Materials can be deposited, for example, using chemical vapor deposition, physical vapor deposition, atomic layer deposition, spin coating, plating, and/or other suitable techniques. Similarly, materials can be removed, for example, using plasma etching, wet etching, chemical-mechanical planarization, or other suitable techniques.

The present technology includes a semiconductor device having an interconnect structure for backside electrical connection formed (e.g., "pre-positioned") during front-end-of-line (FEOL) processing. FEOL is the stage of integrated circuit fabrication in which individual devices (transistors, capacitors, resistors, etc.) are formed at the active side of the semiconductor material. In contrast to the present technology, FEOL processes occur before fabricating metal interconnect structures at the backside. Conventional semiconductor device packages use back-end-of-line (BEOL) processing to form contact pads, through silicon vias, interconnect wires, and/or dielectric structures. During BEOL processing, metals and/or dielectric materials are deposited on the wafer to create contacts, insulating materials, metal levels, and/or bonding sites for chip-to-chip and chip-to-package connections. After BEOL processing, a probe stage is performed to physically acquire signals from the internal nodes of a semiconductor device for failure analysis and defect detection. Following the probe stage, post-probe processing is performed, which includes processes on the front side and/or the backside, including, e.g., three-dimensional integration (3DI) processing among other processing.

The present technology is generally directed to forming an interconnect structure during FEOL processing (e.g., gate level processing) at or near the active side of the die and exposing or otherwise accessing the pre-positioned interconnect structure during BEOL or post-probe processing with ultra-thin silicon processing or total silicon removal. In some embodiments, the present technology eliminates the need for forming BEOL TSVs, allows direct-to-device routing, and enables ultra-thin die stacking among other advantages over conventional process. In some embodiments, an interconnect area is formed in or on the substrate during first level FEOL processing. The FEOL processed interconnect or interconnect area has an active contact surface that is at least partially buried within the substrate material and/or dielectric materials during at least a portion of the FEOL processing. The FEOL interconnect is then revealed for access from the backside during BEOL or post-probe processing.

Various FEOL interconnect configurations are within the scope of the present technology, such as array, sacrificial oxide, etc., or any combination thereof. Processing of three-dimensional integration (3DI) using the present technology is expected to reduce cost and provide a high degree of design flexibility for routing and other structures. For example, backside routing components can be formed during FEOL processing and accessed for electrical connection through the substrate during BEOL or post-probe processing, as will be described below. In contrast, conventional processing requires forming backside routing components by patterning, etching, and filling deep holes in the silicon material to create through silicon vias during BEOL processing, which poses various challenges, e.g., etching and filling relatively deep holes, processing without damaging thin layers, layout design limitations, etc. In these regards, interconnects of the present technology are more directly integrated than conventional device connections. Some embodiments can be applied to bonded microelectronic devices, such as NAND circuits, among others. In these configurations, separate complementary metal-oxide-semiconductor (CMOS) and array chips are bonded together face-to-face. During FEOL processing, a FEOL interconnect is pre-positioned in the silicon material and/or the dielectric materials of the array chip assembly and accessed for electrical connection through the backside of the array chip assembly. In some embodiments, the CMOS assembly includes periphery circuit devices that support the array, but generally does not include memory cells and access devices; and the array assembly includes wordlines, bitlines, access devices, and memory cells, but generally does not include periphery circuit devices such as drivers, latches, controllers, regulators, etc.

FIGS. 1A-1F show enlarged cross-sectional views of various stages of fabricating a semiconductor device comprising an array chip assembly 100 ("array assembly 100") and a CMOS chip assembly 200 (CMOS 200) in accordance with embodiments of the present technology. The array assembly 100 includes a substrate 110, such as a silicon, silica, or silicate substrate, on which various materials and components may be formed. The array assembly 100 also includes a dielectric material 112 on the substrate 110. The dielectric material 112 can be silicon oxide or another non-conductive material grown or deposited on the substrate 110, or the dielectric material 112 can be a non-resin or other inorganic material capable of withstanding temperatures over 600° C. The dielectric material can have FEOL pre-positioned interconnects ("first FEOL interconnects 122*a*" and "second FEOL interconnects 122*b*"). The first and second FEOL interconnects 122*a* and 122*b* are at least partially embedded within the dielectric material 112 in this example. In other embodiments, the first and/or second FEOL interconnects 122*a* and 122*b* extend through the dielectric material 112 and are at least partially embedded within the substrate 110 such that the FEOL interconnects can be exposed from the backside without completely removing the substrate material.

The array assembly 100 may further include a first 3D memory array 120*a* proximate the dielectric material 112 and having a first plurality of stacked memory array layers 121*a* electrically connected to the first FEOL interconnects 122*a*, and a second 3D memory array 120*b* proximate the dielectric material 112 and having a second plurality of stacked memory array layers 121*b* electrically connected to the second FEOL interconnects 122*b*. The first and second 3D memory arrays 120*a* and 120*b* may be destined for separate memory devices after subsequent singulation and although each illustrated with ten array layers in a stacked configuration in the instant example, may have any number of array layers. The array assembly 100 may also have multi-height pillars 136 defining interconnects that electrically couple the first memory array layers 121*a* to one or more bond pads 130 through conductive traces/caps 132 and 134 (e.g., copper, solder, etc.). Although not shown, similar multi-height pillars, bond pads, traces, and caps may be associated with the second memory array layers 121*b*. In some embodiments, the array assembly 100 may also include one or more bond pads 140*a* electrically connected to the first FEOL interconnects 122*a*, for example using a TSV 146*a* connected to the bond pad 140*a* through conductive traces/caps 142*a* and 144*a*. Similarly, the array assembly 100 may also include one or more bond pads 140*b* electrically connected to the second FEOL interconnects 122*b*, for example using a TSV 146*b* connected to the bond pad 140*b* through conductive traces/caps 142*b* and 144*b*. A dielectric material 118 may encase components of the semiconductor device, e.g., the first and second 3D memory arrays 120*a* and 120*b*, the pillars 136, the bond pads 130, 140*a*, 140*b*, and 210, etc. Although one configuration of the array assembly 100 is depicted in the Figures, any suitable configuration of the array assembly 100 is also within the scope of the present technology.

Figure 1C:
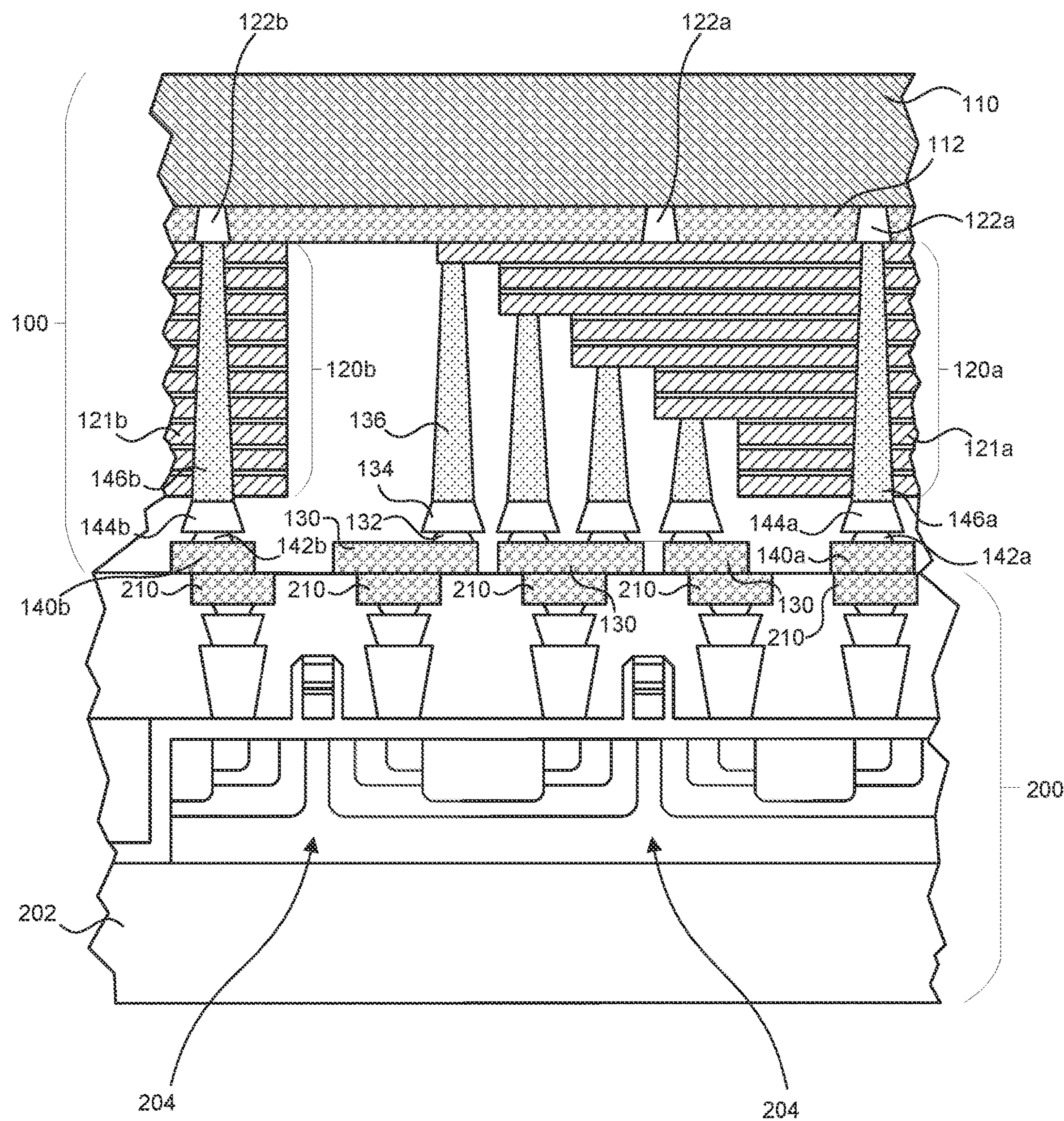

The CMOS 200 may be any suitable CMOS chip and includes a substrate 202, active electrical components 204 (e.g., transistor, etc.), and bond pads 210 configured to be electrically connected to the bond pads 130, 140*a*, and 140*b* of the array assembly 100. As shown in FIG. 1A, the array assembly 100 and the CMOS 200 are separately formed and prepared for bonding through the bond pads 130, 140*a*, and 140*b* of the array assembly 100, and bond pads 210 of the CMOS 200. Next, in FIG. 1B, the array assembly 100 is flipped such that the array assembly 100 and the CMOS 200 are face-to-face to position the bond pads 130, 140*a*, and 140*b* facing toward the bond pads 210. As shown, each bond pad of the array assembly 100 corresponds to a separate bond pad 210 of the CMOS 200; however, in other embodiments, any of the bond pads may be configured to bond to multiple other of the bond pads in a bridging configuration. In FIG. 1C, the bond pads 130, 140*a*, and 140*b* of the array assembly 100 are mated and bonded to the bond pads 210 of the CMOS 200 to form electrical connections between the array assembly 100 and the CMOS 200.

Figure 1D:
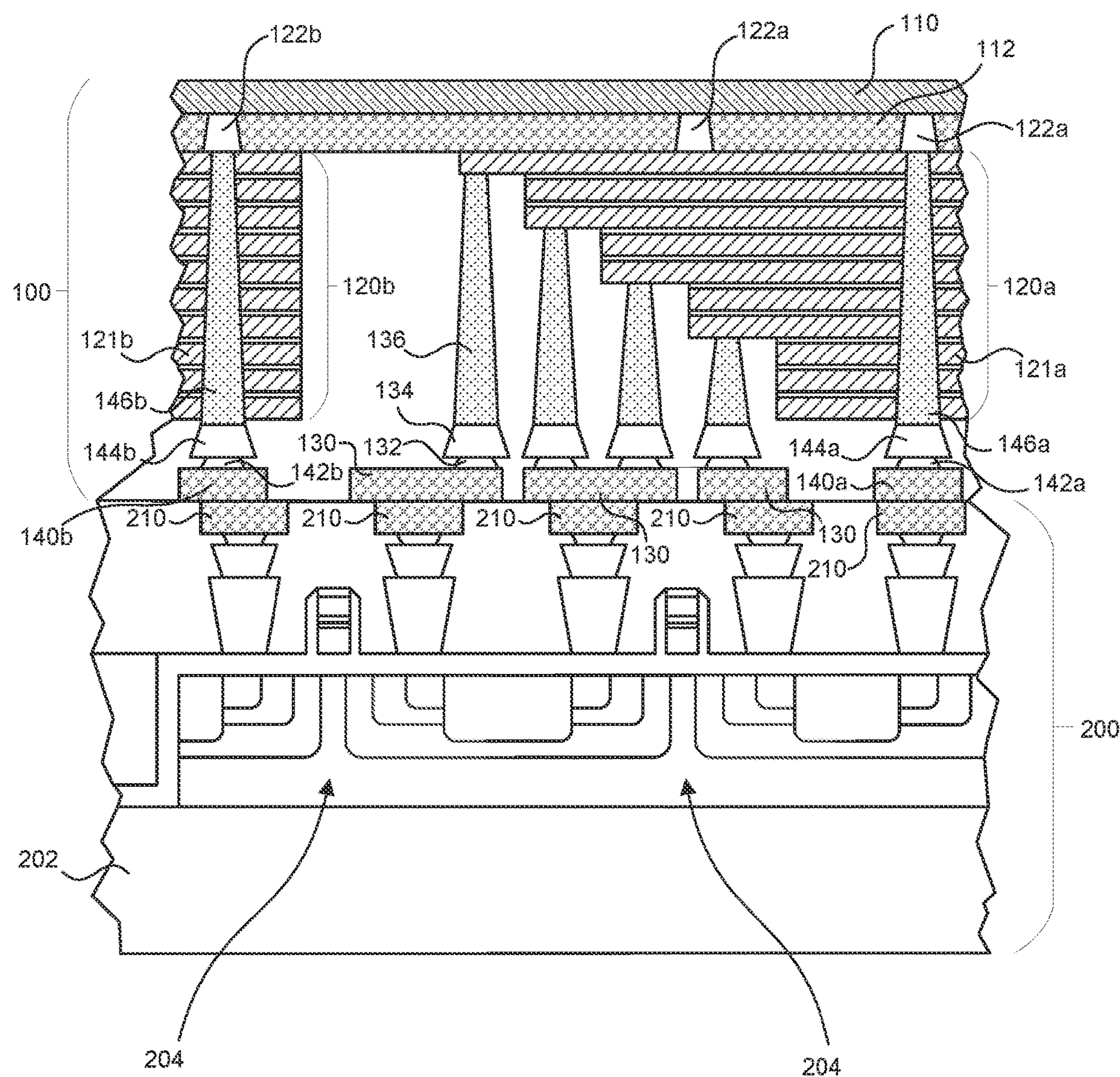
Figure 1E:
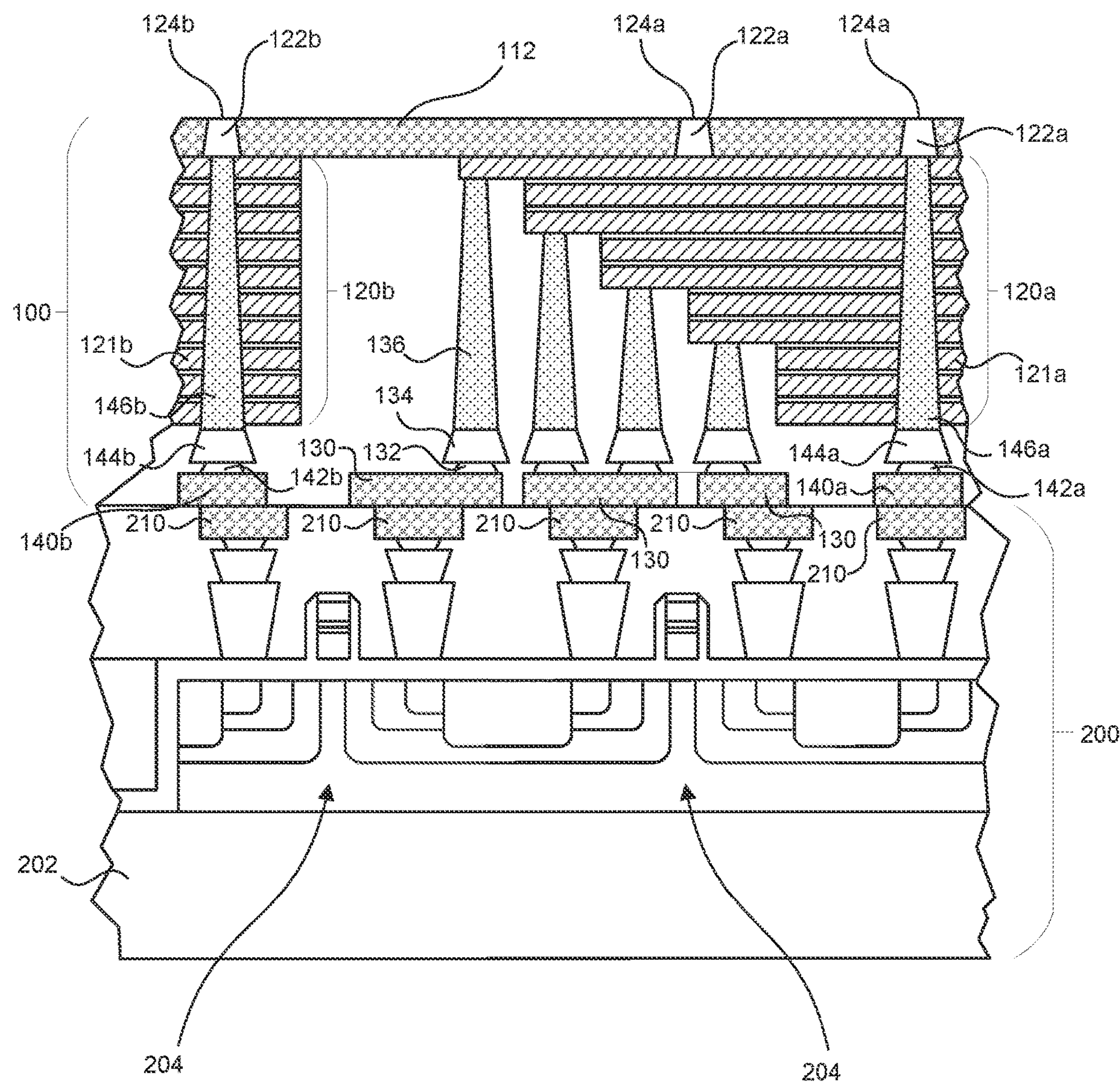

FIG. 1D shows a BEOL grinding process configured to remove material and thin the substrate 110; however, grinding is stopped prior to reaching the depth of the first and second FEOL interconnects 122*a* and 122*b* such that the devices and structure remains intact. As shown next in FIG. 1E, the silicon substrate 110 is removed by bulk silicon blanket etching, e.g., a wet etch, a dry etch, etc., to expose a backside 124*a* of the first FEOL interconnects 122*a* and a backside 124*b* of the second FEOL interconnects 122*b* accessible from the backside of the array assembly 100.

Figure 1F:
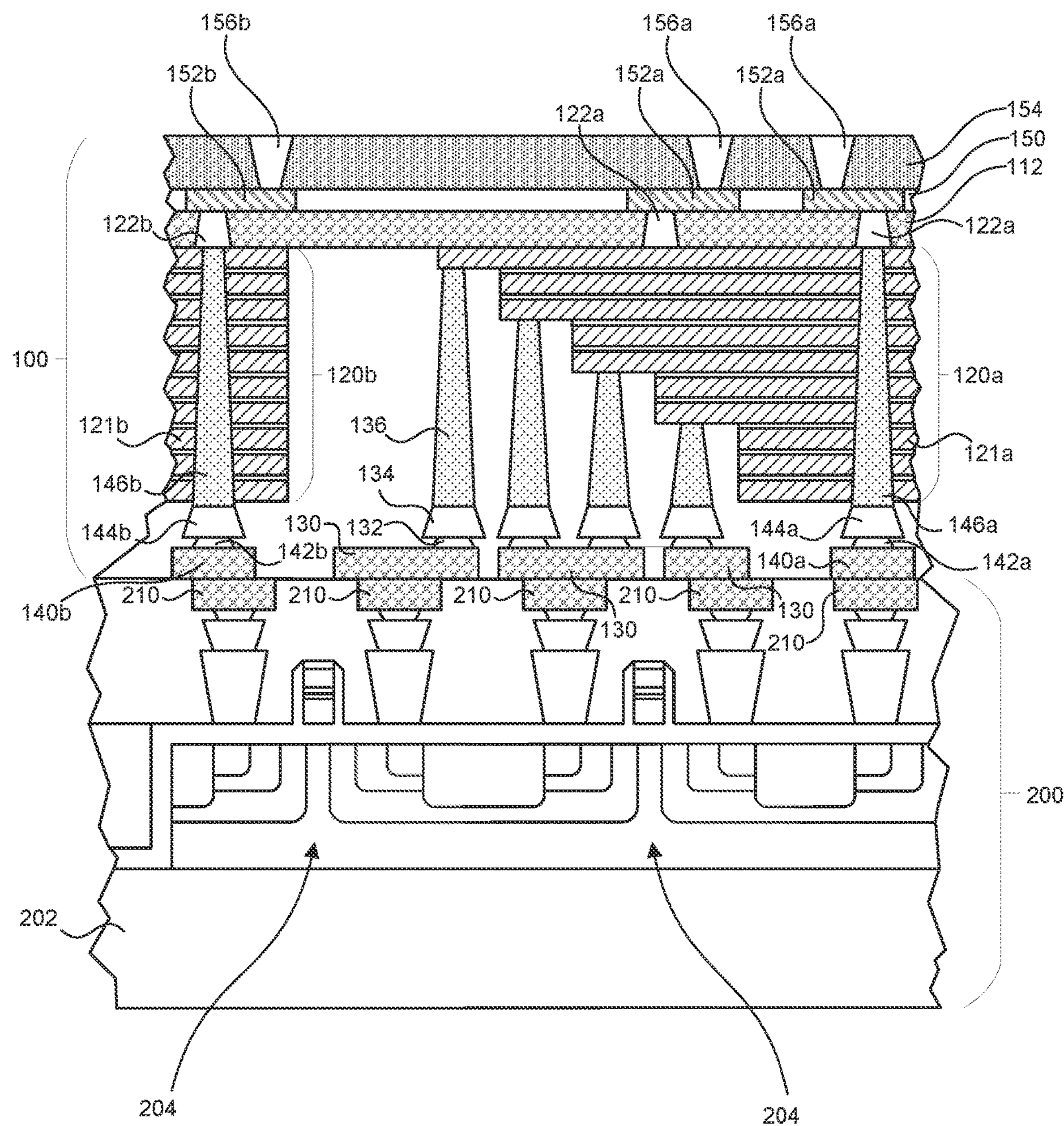
Figure 1G:
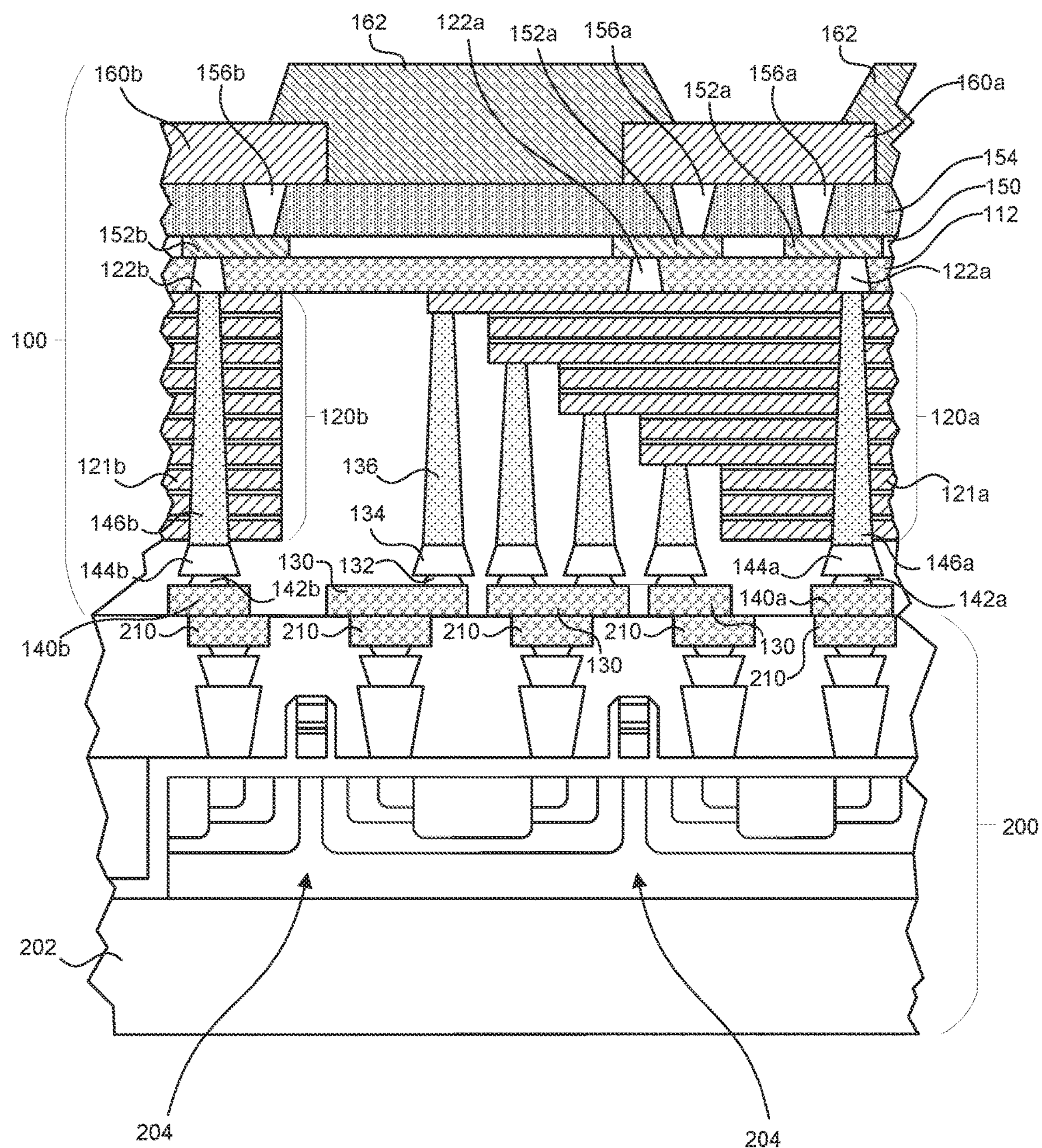

During the removal of the silicon substrate 110, the dielectric material 112 may be exposed on the backside of the array assembly 100. FIG. 1F shows various backside routing features (formed during BEOL) for forming electrical connections through the FEOL interconnects 122_a_ and 122_b_ to components of the array assembly 100 (e.g., the first and second 3D memory arrays 120_a_ and 120_b_). The routing features may be formed on the backside of the array assembly 100 with a first patterning process to create first and second conductive traces 152_a_ and 152_b_ in a second dielectric passive insulating material 150, and a second patterning process to create first and second routing interconnect vias 156_a_ and 156_b_ in a third dielectric material 154. In FIG. 1G, the first and second conductive routing interconnects 156_a_ and 156_b_ can be further patterned to create first and second bond pads 160_a_ and 160_b_ to receive assembly interconnects, solder balls, pillars, 3DI interconnects, etc. A dielectric passivation layer 162, e.g., a nitride or polyamide material, can be added to form the final pattern and protects the surface of the third dielectric material 154 from impingement during bonding. Although one configuration of an FEOL interconnect is shown in FIGS. 1A-1G, other configurations are within the scope of the present technology.

Figure 2A:
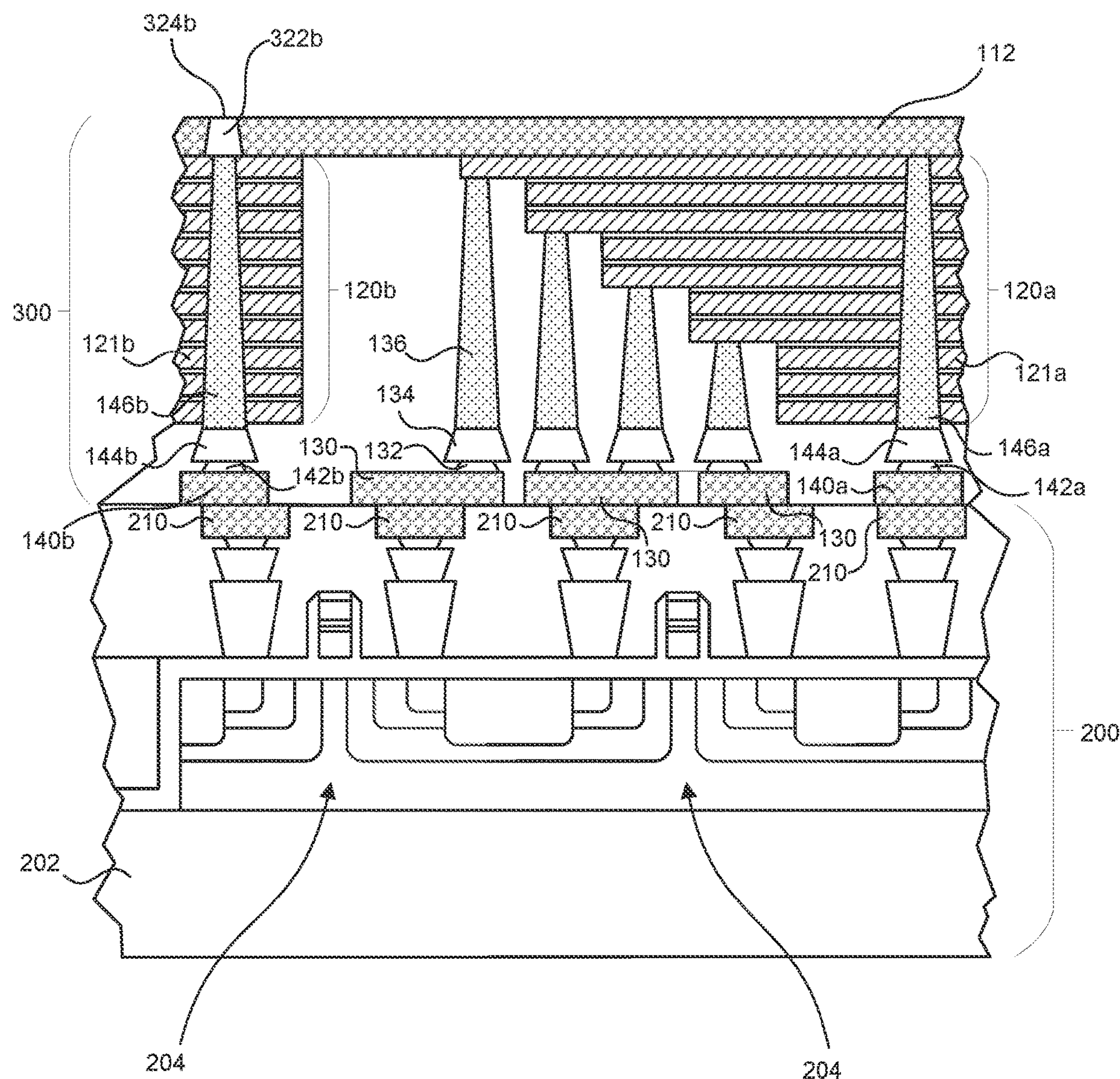
FIGS. 2A and 2B are enlarged cross-sectional views showing semiconductor devices having a front-end-of-line interconnect structure in accordance with embodiments of the present technology.
Figure 2B:
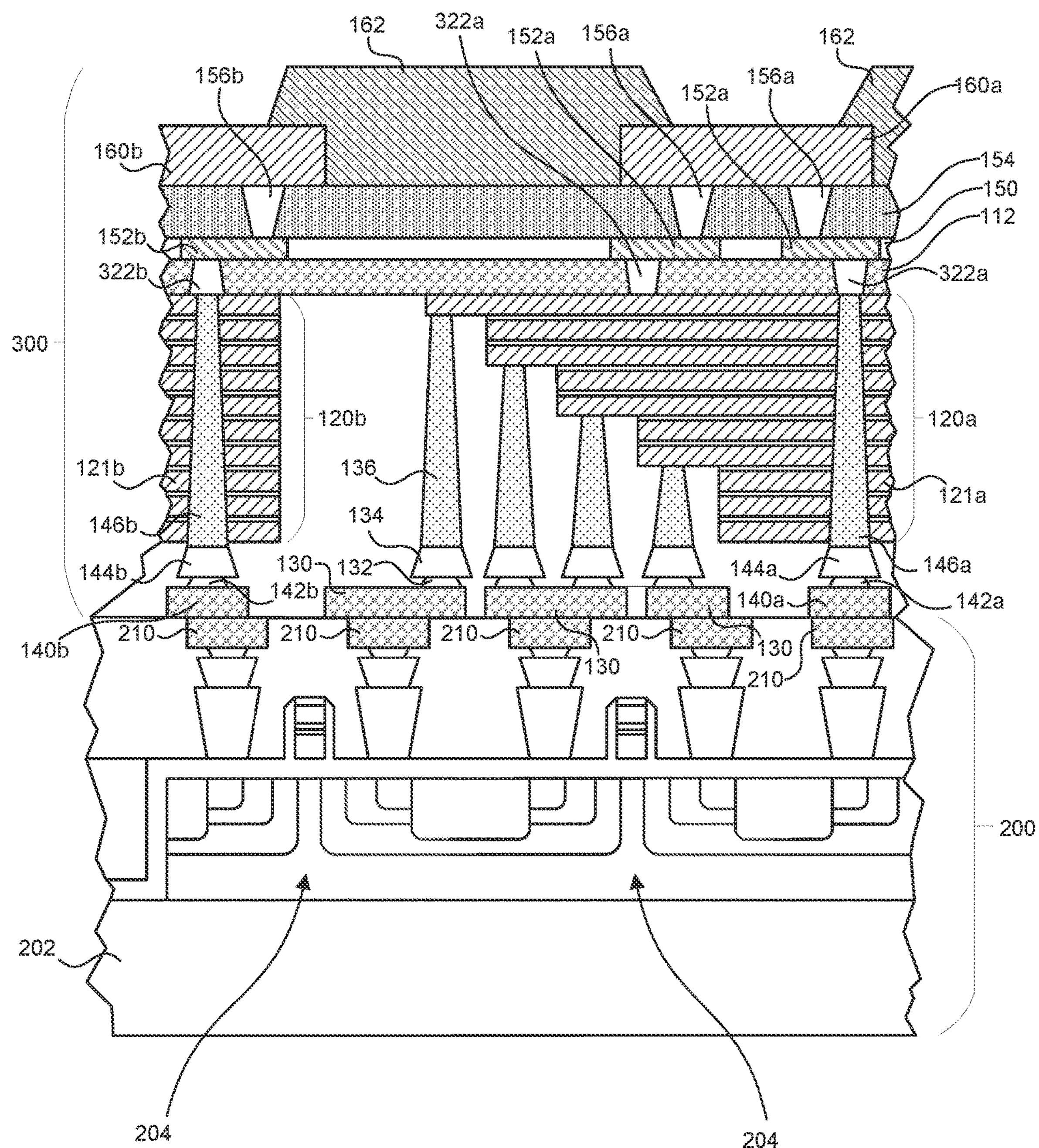

FIGS. 2A and 2B show enlarged cross-sectional views of semiconductor devices having an FEOL interconnect structure configured in accordance with additional embodiments of the present technology. FIGS. 2A and 2B show an array chip assembly 300 ("array assembly 300") which is similar in overall structure and configuration to the array assembly 100 of FIGS. 1A-1G, except that the array assembly 300 shows a variation of FEOL interconnects. The configurations of the FEOL interconnects in FIGS. 2A and 2B are intended to illustrate one variation of the FEOL interconnects; however, further suitable variations are within the scope of the present technology. In FIG. 2A, similar steps to those in FIGS. 1A-1E have already been performed to the semiconductor device having the array assembly 300 (e.g., bond pad connections, grinding, etching, and removal of the substrate, etc.), such that the exposed FEOL interconnect is shown (e.g., similar to the state of the semiconductor device in FIG. 1E). The CMOS 200 is shown with the same general configuration as in FIGS. 1A-1G Like reference numbers to the embodiments of FIGS. 1A-1G refer to similar features in FIGS. 2A and 2B, but may have variations and/or have different shapes and sizes, while features in the 300-series in FIGS. 2A and 2B correspond to features of the array assembly 300 differing from the array assembly 100.

FIG. 2A shows an embodiment of the array chip assembly 300 bonded to the CMOS 200. The array assembly 300 includes FEOL interconnects 322_b_ having a backside 324_b_, generally similar to the FEOL interconnects 122_b_ of the array assembly 100 in that the FEOL interconnects 322_b_ are formed in the dielectric material 112 during FEOL processing. The array assembly 300 omits FEOL interconnects corresponding to the FEOL interconnects 122_a_ of the array assembly 100. Instead, as shown in FIG. 2B, BEOL interconnects 322_a_ are formed during BEOL processing to form electrical connections with the first 3D memory array 120_a_. After the BEOL interconnects 322_a_ are formed, the remaining operations for forming electrical connections with the FEOL interconnects 322_b_ and the BEOL interconnects 322_a_, including the backside routing, final pad patterning, and passivation, are similar to those of FIGS. 1F and 1G, described above.

Figure 3A:
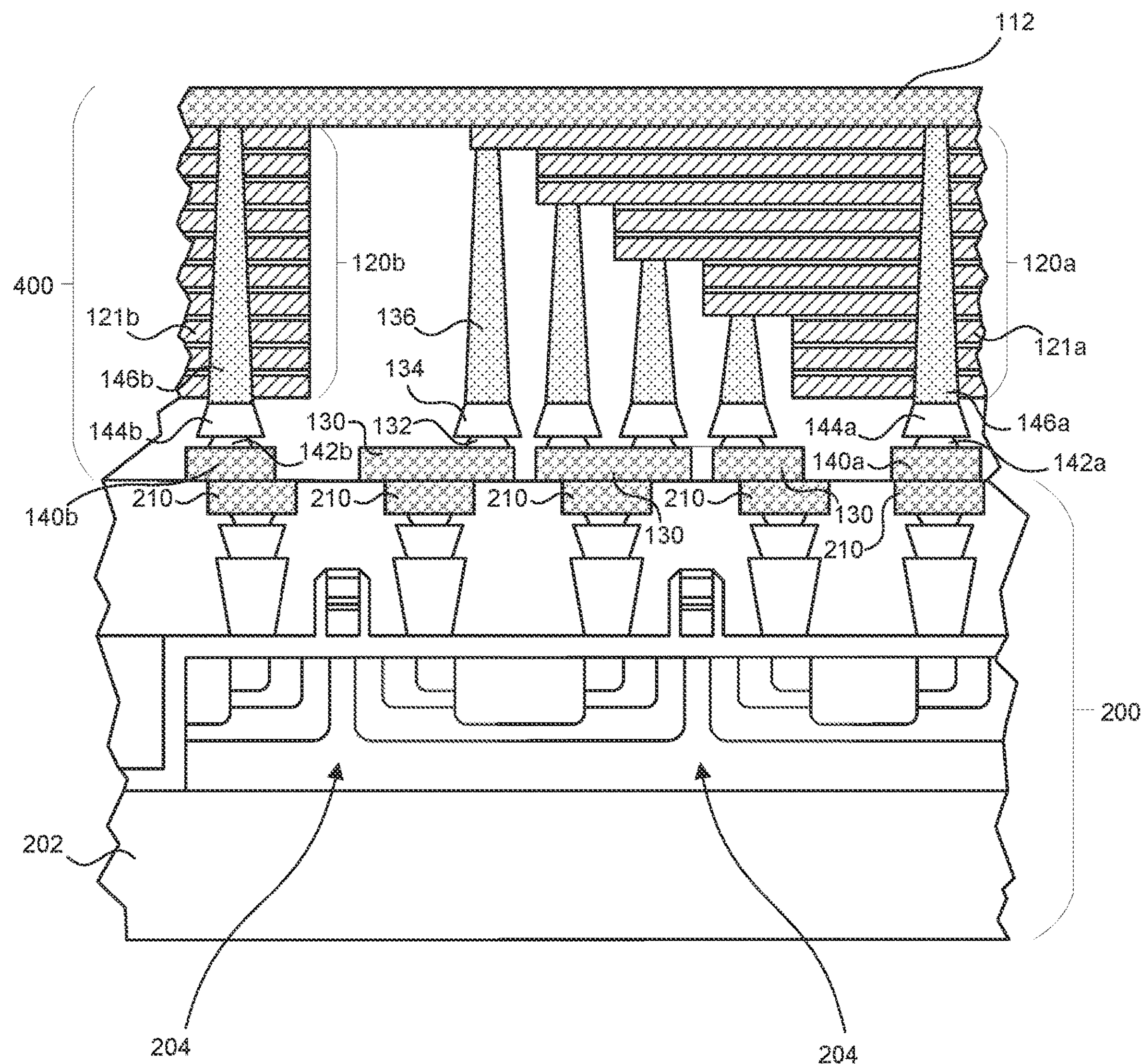
FIGS. 3A and 3B are enlarged cross-sectional views showing semiconductor devices having a front-end-of-line interconnect structure in accordance with embodiments of the present technology.
Figure 3B:
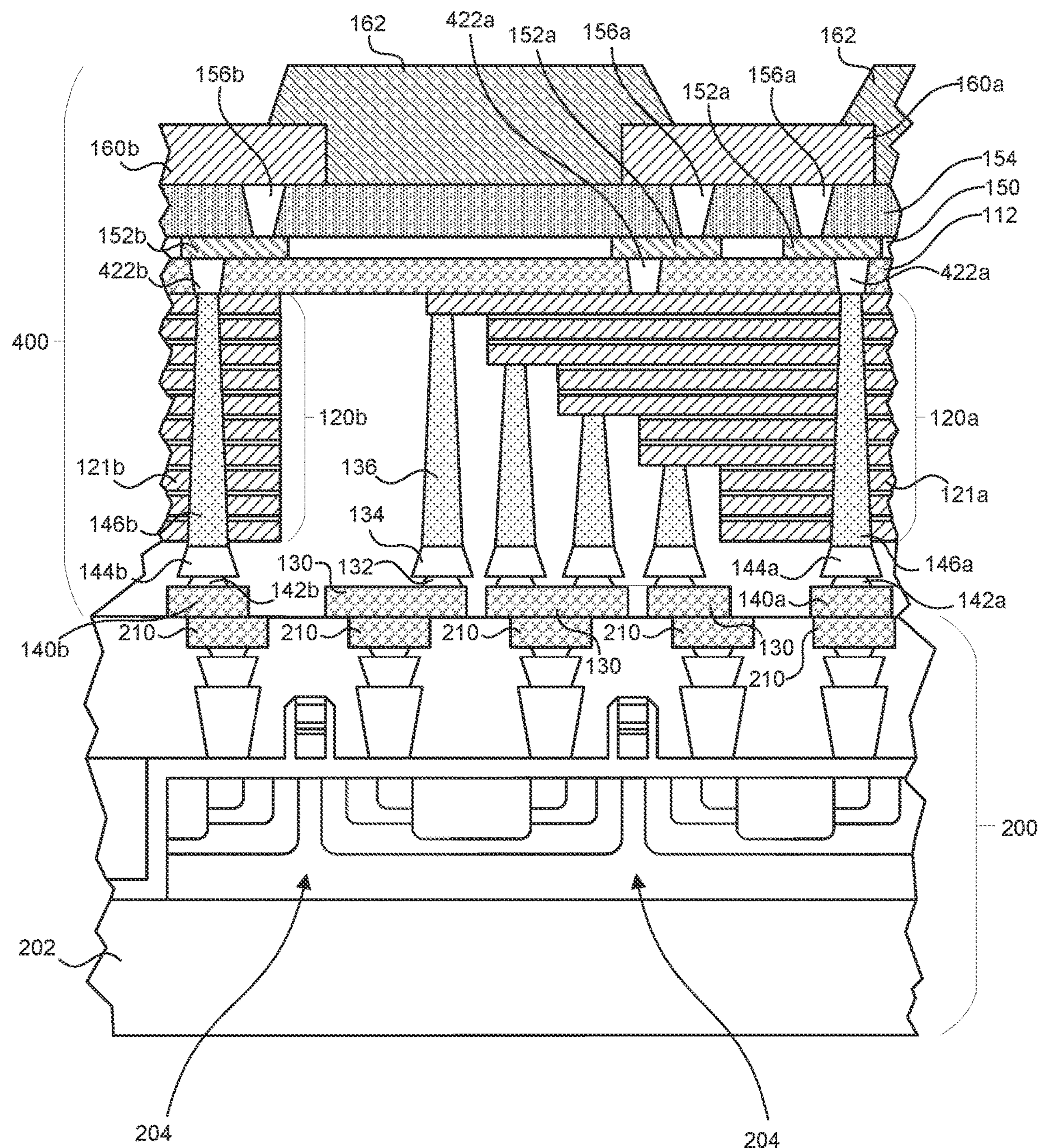

FIGS. 3A and 3B show enlarged cross-sectional views of semiconductor devices having been configured in accordance with additional embodiments of the present technology. FIGS. 3A and 3B show an array chip assembly 400 ("array assembly 400") which is similar in overall structure and configuration to the array assembly 100 of FIGS. 1A-1G, except that the array assembly 400 shows a variation of FEOL and BEOL processing. The configurations of the FEOL structure in FIGS. 3A and 3B are intended to illustrate one variation of the FEOL processing; however, further suitable variations are within the scope of the present technology. In FIG. 3A, similar steps to those in FIGS. 1A-1E have already been performed to the semiconductor device having the array assembly 400 (e.g., bond pad connections, grinding, etching, and removal of the substrate, etc.), such that the substrate is removed to expose the dielectric material (e.g., similar to the state of the semiconductor device in FIG. 1E, with a different FEOL structure). The CMOS 200 is shown with the same general configuration as in FIGS. 1A-1G. Like reference numbers to the embodiments of FIGS. 1A-1G refer to similar features in FIGS. 3A and 3B, but may have variations and/or have different shapes and sizes, while features in the 400-series in FIGS. 3A and 3B correspond to features of the array assembly 400 differing from the array assembly 100.

FIG. 3A shows an embodiment of the array chip assembly 400 bonded to the CMOS 200. The array assembly 400 does not have interconnect vias formed during FEOL processing (e.g., the interconnect vias 122_a_ and 122_b_ of the array assembly 100). The omission of such interconnect vias can prevent complications during BEOL processing, such as arcing during the etching process, and allows selective forming of interconnect vias in a desired layout pattern. In this regard, the first and second conductive traces 152_a_ and 152_b_ and the third dielectric material 154 can be omitted in some embodiments of the array assembly 400. As shown in FIG. 3B, first and second BEOL interconnect vias 422_a_ and 422_b_ are formed during BEOL processing for electrical connection to the first and second 3D memory arrays 120_a_ and 120_b_ on the backside of the array assembly 400. After the BEOL interconnects 422_a_ and 422_b_ are formed, the remaining operations for forming further electrical connections with the BEOL interconnects 422_a_ and 422_b_, including the backside routing, final pad patterning, and passivation, are similar to those of FIGS. 1F and 1G, described above.

The interconnects described herein may be formed from suitable conductive materials, such as copper (Cu), and may have solder caps to form the electrical connections (e.g., tin-silver (SnAg) solder caps). During assembly, the solder cap can be reflowed using gang reflow, sonic reflow, or other techniques. The bond pads can be copper pads and may be bonded using copper-to-copper bonding or other suitable techniques.

Figure 4:
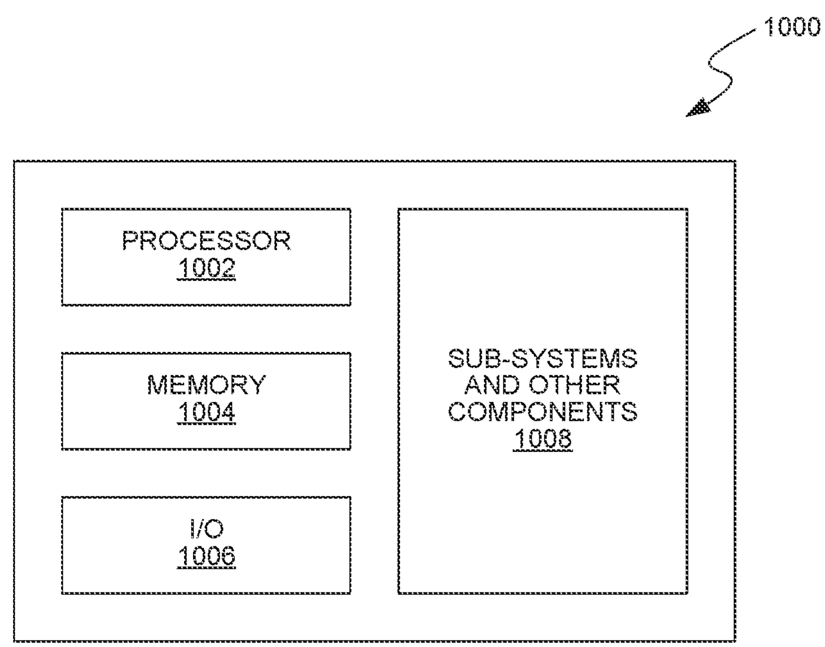
FIG. 4 is a schematic view of a system that includes a semiconductor device in accordance with embodiments of the present technology.

FIG. 4 is a block diagram illustrating a system that incorporates a semiconductor device in accordance with embodiments of the present technology. Any one of the semiconductor devices having the features described above with reference to FIGS. 1A-3B can be incorporated into any of a myriad of larger and/or more complex systems, a representative example of which is system 1000 shown schematically in FIG. 4. The system 1000 can include a processor 1002, a memory 1004 (e.g., SRAM, DRAM, flash, and/or other memory devices), input/output devices 1006, and/or other subsystems or components 1008. The semiconductor assemblies, devices, and device packages described above with reference to FIGS. 1A-3B can be included in any of the elements shown in FIG. 4. The resulting system 1000 can be configured to perform any of a wide variety of suitable computing, processing, storage, sensing, imaging, and/or other functions. Accordingly, representative examples of the system 1000 include, without limitation, computers and/or other data processors, such as desktop computers, laptop computers, Internet appliances, hand-held devices (e.g., palm-top computers, wearable computers, cellular or mobile phones, personal digital assistants, music players, etc.), tablets, multi-processor systems, processor-based or programmable consumer electronics, network computers, and minicomputers. Additional representative examples of the system 1000 include lights, cameras, vehicles, etc. In these and other examples, the system 1000 can be housed in a single unit or distributed over multiple interconnected units, e.g., through a communication network. The components of the system 1000 can accordingly include local and/or remote memory storage devices and any of a wide variety of suitable computer-readable media.

As used in the foregoing description, the terms "vertical," "lateral," "upper," and "lower" can refer to relative directions or positions of features in the semiconductor devices in view of the orientation shown in the Figures. For example, "upper" or "uppermost" can refer to a feature positioned closer to the top of a page than another feature. These terms, however, should be construed broadly to include semiconductor devices having other orientations, such as inverted or inclined orientations where top/bottom, over/under, above/below, up/down, left/right, and distal/proximate can be interchanged depending on the orientation. Moreover, for ease of reference, identical reference numbers are used to identify similar or analogous components or features throughout this disclosure, but the use of the same reference number does not imply that the features should be construed to be identical. Indeed, in many examples described herein, identically numbered features have a plurality of embodiments that are distinct in structure and/or function from each other. Furthermore, the same shading may be used to indicate materials in cross section that can be compositionally similar, but the use of the same shading does not imply that the materials should be construed to be identical unless specifically noted herein.

The foregoing disclosure may also reference quantities and numbers. Unless specifically stated, such quantities and numbers are not to be considered restrictive, but exemplary of the possible quantities or numbers associated with the new technology. Also, in this regard, the present disclosure may use the term "plurality" to reference a quantity or number. In this regard, the term "plurality" is meant to be any number that is more than one, for example, two, three, four, five, etc. For the purposes of the present disclosure, the phrase "at least one of A, B, and C," for example, means (A), (B), (C), (A and B), (A and C), (B and C), or (A, B, and C), including all further possible permutations when greater than three elements are listed.

From the foregoing, it will be appreciated that specific embodiments of the new technology have been described herein for purposes of illustration, but that various modifications may be made without deviating from the present disclosure. Accordingly, the invention is not limited except as by the appended claims. Furthermore, certain aspects of the new technology described in the context of particular embodiments may also be combined or eliminated in other embodiments. Moreover, although advantages associated with certain embodiments of the new technology have been described in the context of those embodiments, other embodiments may also exhibit such advantages and not all embodiments need necessarily exhibit such advantages to fall within the scope of the present disclosure. Accordingly, the present disclosure and associated technology can encompass other embodiments not expressly shown or described herein.

We claim:

1. A semiconductor device, comprising:

a first dielectric material having a backside and a front side opposite the backside;

an interconnect structure extending through the first dielectric material, the interconnect structure having a back surface coplanar with the backside of the first dielectric material defining an active contact surface and a surface side opposite the back surface and coplanar with the frontside of the first dielectric material;

a semiconductor memory array proximate the front side of the first dielectric material and electrically connected to the front side of the interconnect structure;

an insulating material encasing at least a portion of the semiconductor memory array;

a second dielectric material having an opening through which the active contact surface at the back surface of the interconnect structure is exposed for electrical connection; and a conductive trace formed on the active contact surface and electrically connected to the semiconductor memory array through the interconnect structure.

2. The semiconductor device of claim 1, wherein the first dielectric material comprises silicon dioxide.

3. The semiconductor device of claim 1, further comprising an interconnect via formed on the conductive trace and electrically connected to the semiconductor memory array through the conductive trace and the interconnect structure.

4. The semiconductor device of claim 1, wherein the second dielectric layer comprises a passivation layer formed on the first dielectric material.

5. The semiconductor device of claim 4, wherein the passivation layer comprises a nitride material or a polyamide material.

6. The semiconductor device of claim 1 wherein the first dielectric material comprises a non-resin material.

7. The semiconductor device of claim 1, wherein:

the semiconductor memory array comprises a base array layer and additional array layers stacked on the base array layer to define a stacked memory array, and the semiconductor device includes bond pads electrically connected to the stacked memory array; and a CMOS chip assembly electrically connected to the stacked memory array via the bond pads.

8. The semiconductor device of claim 7, wherein, when the stacked memory array and the CMOS chip assembly are bonded, the active contact surface of the interconnect structure is electrically connected to a component of the CMOS chip assembly.

9. A semiconductor device, comprising:

a dielectric material having a backside and a front side opposite the backside;

a semiconductor memory array proximate the front side of the dielectric material;

an insulating material encasing at least a portion of the semiconductor memory array;

an opening through the dielectric material to the semiconductor memory array;

an interconnect structure extending through the opening of the dielectric material, the interconnect structure having a back surface coplanar with the backside of the dielectric material defining an active contact surface and a front surface opposite the back surface and coplanar with the frontside of the dielectric material, the front surface electrically connected to the semiconductor memory array, wherein the active contact surface at the back surface of the interconnect structure is exposed for electrical connection; and an interconnect via formed on the interconnect structure and electrically connected to the semiconductor memory array.

10. The semiconductor device of claim 9, further comprising a passivation layer formed on the dielectric material.

11. The semiconductor device of claim 10, wherein the passivation layer comprises a nitride material or a polyamide material.

12. The semiconductor device of claim 9, wherein:

the semiconductor memory array comprises a base array layer and additional array layers stacked on the base array layer to define a stacked memory array, and the semiconductor device includes bond pads electrically connected to the stacked memory array; and a CMOS chip assembly electrically connected to the stacked memory array via the bond pads.

13. The semiconductor device of claim 12, wherein, when the stacked memory array and the CMOS chip assembly are bonded, the active contact surface of the interconnect structure is electrically connected to a component of the CMOS chip assembly.

14. A method for forming an electrical connection on the backside of a semiconductor device, the method comprising:

forming, during front-end-of-line processing of the semiconductor device— a dielectric material on a semiconductor substrate material, the dielectric material having a backside on the substrate material and a front side opposite the backside;

an interconnect structure through the dielectric material to the substrate material, the interconnect structure having a back surface coplanar with the backside of the dielectric material and electrically connected to a semiconductor memory array proximate the front side of the dielectric material and having a front surface opposite the back surface and coplanar with the frontside of the dielectric material; and an active contact surface on the back surface of the interconnect structure; and exposing the active contact surface for electrical connection access by removing the substrate material adjacent to the active contact surface.

15. The method of claim 14, wherein the interconnect structure comprises a first interconnect structure and the semiconductor memory array comprises a first semiconductor memory array, and wherein the method further comprises forming, during back-end-of-line processing of the semiconductor device, a second interconnect structure through the dielectric material, the second interconnect structure having a back surface coplanar with the backside of the dielectric material and electrically connected to a second semiconductor memory array proximate the front side of the dielectric material.

16. The method of claim 14, further comprising forming a passive insulating material on the dielectric material after removing the substrate material.

17. The method of claim 14, wherein removing the substrate material comprises forming an opening through the substrate material to expose the active contact surface.

18. The method of claim 14, wherein:

the semiconductor device is an array chip assembly; and the array chip assembly is bonded to a CMOS chip assembly prior to removing the substrate material adjacent to the active contact surface to expose the active contact surface.

* * * * *